United States Patent [19]

Krajewski et al.

[11] Patent Number: 5,152,696
[45] Date of Patent: Oct. 6, 1992

[54] Z-AXIS CONNECTORS FOR STACKED PRINTED CIRCUIT BOARD ASSEMBLIES

[75] Inventors: Nicholas J. Krajewski; David J. Johnson, both of Chippewa Falls; Arthur O. Kunstmann, Weyerhauser, all of Wis.

[73] Assignee: Cray Research, Inc., Minneapolis, Minn.

[21] Appl. No.: 679,653

[22] Filed: Apr. 2, 1991

Related U.S. Application Data

[63] Continuation-in-part of Ser. No. 514,865, Apr. 26, 1990, abandoned.

[51] Int. Cl.⁵ .................................. H01R 9/09
[52] U.S. Cl. ................................. 439/75; 439/931
[58] Field of Search ............... 439/74, 75, 931, 45–48; 29/830

[56] References Cited

U.S. PATENT DOCUMENTS

| | | |
|---|---|---|
| 2,926,340 | 2/1960 | Blain et al. . |
| 3,022,480 | 2/1962 | Tiffany . |
| 3,097,032 | 7/1963 | Hochheiser . |
| 3,212,049 | 10/1965 | Mittler et al. . |
| 3,217,283 | 11/1965 | Shlesinger ............. 439/47 |
| 3,319,217 | 5/1967 | Phillips . |
| 3,333,225 | 7/1967 | McNutt . |
| 3,400,358 | 9/1968 | Byrnes et al. . |
| 3,404,370 | 10/1968 | Bryner et al. ............ 439/931 |
| 3,459,998 | 8/1969 | Focarile . |
| 3,568,001 | 3/1971 | Straus . |
| 3,634,819 | 1/1972 | Evans . |
| 3,783,433 | 1/1974 | Kurtz et al. . |
| 3,786,558 | 1/1974 | McCarthy . |
| 3,853,377 | 12/1974 | Shlesinger, Jr. . |
| 3,904,934 | 9/1975 | Martin . |
| 3,913,444 | 10/1975 | Otte . |
| 4,076,356 | 2/1978 | Tamburro . |
| 4,155,321 | 5/1979 | Tamburro . |
| 4,216,576 | 8/1980 | Ammon et al. . |
| 4,446,505 | 5/1984 | Long et al. ............ 439/387 |
| 4,737,114 | 4/1988 | Yaegashi . |
| 4,746,301 | 5/1988 | Key . |
| 4,776,807 | 10/1988 | Triner et al. . |
| 4,889,496 | 12/1989 | Neidich . |
| 4,969,259 | 11/1990 | Macek et al. . |

FOREIGN PATENT DOCUMENTS

| | | |
|---|---|---|
| 608258 | 11/1960 | Canada . |
| 2742716 | 4/1979 | Fed. Rep. of Germany . |
| WO88/09599 | 12/1988 | PCT Int'l Appl. . |
| 1035580 | 7/1966 | United Kingdom . |

Primary Examiner—Neil Abrams
Attorney, Agent, or Firm—Merchant, Gould, Smith, Edell, Welter & Schmidt

[57] ABSTRACT

Z-axis connectors for interconnecting stacked printed circuit boards are formed from resilient material and have contact sections larger than cooperating through-plated holes formed in the boards. The connectors are drawn through the through-plated holes in the stacked circuit board, causing the contact section of the connector to frictionally engage the through-plated holes on at least two boards.

6 Claims, 2 Drawing Sheets

Z-AXIS CONNECTORS FOR STACKED PRINTED CIRCUIT BOARD ASSEMBLIES

RELATED APPLICATIONS

This application is a continuation-in-part of U.S. patent application Ser. No. 07/514,865 filed on Apr. 26, 1990, and now abandoned, titled Z-AXIS JUMPER CONNECTORS FOR CONNECTING STACKS OF CIRCUIT BOARDS.

FIELD OF THE INVENTION

The present invention relates to the field of electrical circuit connectors, and more specifically to a method and apparatus for interconnecting stacked circuit boards.

BACKGROUND OF THE INVENTION

In a conventional electronic layout, printed circuit boards are used to interconnect integrated circuits. The integrated circuits are coupled to conductive foil patterns located on the circuit boards. This interconnection level is coplanar with the circuit board and defines an X-Y interconnection plane.

When a single board cannot hold all of the circuit components, because of size or required signal flow constraints, several circuit boards may be arranged and interconnected in a number of configurations. One common high density interconnect configuration is a stack of circuit boards which are electrically interconnected with interboard connectors. This corresponds to electrical interconnection in the Z-axis. This three-dimensional packing scheme creates a compact module assembly that has a density limited primarily by heat dissipation and connector spacing requirements.

Although many interboard connectors are suitable for interconnecting stacked circuit boards. Many of these connectors limit the inter-board spacing of stacked circuit boards. This is undesirable in high speed applications where signal timing needs depend on the signal path lengths, the longest of which is termed the "critical path length." To increase circuit operating speed the critical path length must be reduced.

Z-axis connectors address this need. For example, U.S. Pat. No. 4,813,128 issued to Massopust, and assigned to the assignee of the present invention, teaches a method of interconnecting circuit boards using blocks and Z-axis connectors. This type of interconnection scheme reduces the average signal path as compared to a conventional edge type connectors. However, the Massopust structure does not minimize the critical path length because the presence of the blocks limits interboard spacing. As a consequence, the number of connection points is comparable to the number exhibited by an edge connector.

Other Z-axis connectors are disclosed in U.S. Pat. Nos. 3,097,032 issued to Hochheiser, and 2,969,521 issued to Scoville. While the Hochheiser and Scoville inventions do not use blocks, the number of connection points to interconnect the circuit boards is similar to that of edge connectors, and the critical path length is limited by the fork height requirements. Additionally, use of the inventions requires the extra step of placing the contacts on the board.

A Z-axis connection scheme that addresses critical path length limitations is described in U.S. Pat. No. 3,212,049, issued to Mittler et al. Mittler describes a scheme where contact bushings are installed in circuit board holes and placed in electrical contact with the circuit board foil patterns. The circuit boards are then stacked and Z-axis connectors are run through the aligned bushings to interconnect the boards. While the Mittler patent allows a short critical path length, the insertion of bushings into the circuit boards adds complexity and reduces component density. Additionally, the number of contact points remains the same as in the edge connector.

Another Z-axis connection scheme that addresses the critical path length limitations is described in U.S. Pat. No. 3,867,759, issued to Siefker. Siefker describes a method of soldering Z-axis wires in place for stacked strip-line circuits.

SUMMARY OF THE INVENTION

The present invention describes a Z-axis connector useful for interconnecting a dense module of stacked circuit boards in a manner that permits high speed operation by reducing critical signal path lengths and that minimizes the number of contact points. The described Z-axis connectors are inserted into axially aligned through-plated holes on the circuit boards.

The circuit boards used with the present invention are manufactured with through-plated holes electrically connected to a prefabricated foil pattern lying in the X-Y plane. The prefabricated foil pattern connects to integrated circuit bonding pads having integrated circuit chips mounted thereon. The circuit boards are then stacked together in a module assembly.

The module assembly is electrically interconnected by inserting Z-axis connectors into the axially aligned through-plated holes on the circuit boards. By using the Z-axis connectors and the X-Y oriented foil patterns a three dimensional signal routing scheme is created. With proper layout of the components on the circuit boards and the through-plated holes, the critical timing path distance can be reduced over that of standard two dimensional routing schemes.

The Z-axis connectors are constructed with resilient contact sections that are radially larger than the circuit board through-plated holes. When inserted into the through-plated holes, the contact sections compress against the walls of the through-plated holes, creating frictional contact. This frictional contact creates low resistance electrical connections between the Z-axis connector and the circuit board Since the Z-axis connector is electrically conductive, the circuit boards connected to the Z-axis connector are electrically interconnected.

To assist in installing the Z-axis connectors, a leader section is added to the contact section. The leader has a smaller diameter than the through-plated holes. In operation the leader section is inserted into the through-plated holes, and is drawn through the stack of circuit boards. This operation places the connector under tension while the connector is forced into contact with the plated through holes of the circuit board stack.

BRIEF DESCRIPTION OF THE DRAWINGS

Having briefly discussed the invention, it will be better understood from the detailed discussion of the invention that follows taken in conjunction with the attached drawings, wherein.

DETAILED DESCRIPTION OF THE PREFERRED EMBODIMENT

Figure 1:
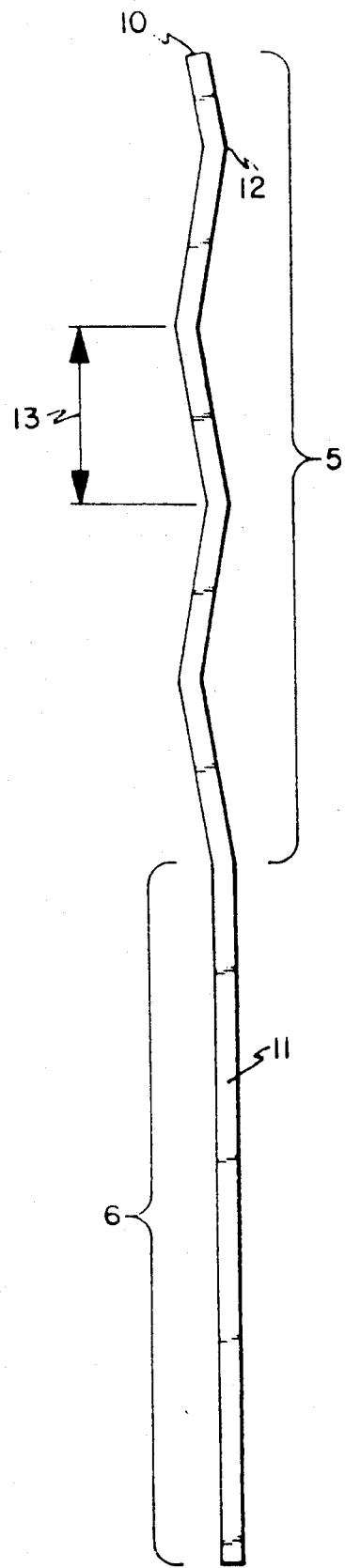
FIG. 1 is an elevational view of a kinked Z-axis connector.

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

The Z-axis connector depicted in the figures is intended for use in the construction of high speed electronic machines such as supercomputers such as the type manufactured by Cray Research, Inc., the assignee of the present invention. Very fast supercomputers rely on high density packaging techniques to place the active circuits in close proximity to each other. Some packaging strategies place passivated dies directly on printed circuit boards and then stack a number of such boards into a module assembly. To optimize this strategy it is important that the connectors be made as small as practical. The Z-axis connectors of the preferred embodiment of this invention are used to interconnect holes having a diameter of approximately 0.006 inches. To use such small connectors it is preferred to insert the connectors into plated-though holes formed in the printed circuit boards and drawing the electrical connection section of the connector into contact with the plated section of the hole.

Reference may be had to U.S. patent application No. 07/053,142 filed 05/21/87 entitled "Lead Bonding of Chips onto Circuit Boards and Circuit Boards to Circuit Boards", U.S. patent application No. 07/335,484 filed 04/10/89 entitled "Compressible Core Twist Pin Connector", and U.S. patent application No. 07/347,507 filed 05/04/89 entitled "Twisted Wire Jumper Electrical Interconnector"; all of which relate to the same general subject matter and which are incorporated by reference herein. Reference should also be made to U.S. patent application No. 07/324,906 filed Mar. 17, 1989 entitled "Memory Metal Connector Pin for Connecting Circuit Boards to Circuit Boards", and the present application's parent application, U.S. patent application Ser. No. 07/514,865, filed on Apr. 26, 1990 entitled "Z-Axis Connectors for Stacked Printed Circuit Board Assemblies", both of which are hereby incorporated by reference.

In general terms, each of the Z-axis connectors described herein in conjunction with the preferred embodiments of the present invention have a resting or relaxed state corresponding to minimum energy. This minimum energy state is exhibited when the connector is not inserted into the module. Work is performed during insertion of the connector into the module. Some energy is stored by deformation of the connector during the insertion process. This stored energy in the connector assists in maintaining a reliable electrical connection between the connector and plated through-holes. Each connector has both a leader section 6 which is used for insertion and an interconnection section 5 which remains within the module. The interconnection section has a contact portion and a spacer portion. In operation, the contact portion frictionally engages the plated through holes while the spacer portion resides in the interboard spacers.

Turning to FIG. 1 there is shown the preferred embodiment of the present invention. The kinked wire body 10 has a uniform circular section of approximately 0.002 inches, and is made from a conductive metallic material exhibiting a spring constant and elastic limit sufficient to provide resilient contact when it is elastically deformed. The preferred material for the connector is beryllium copper alloy because of its relatively high spring constant.

It is preferred to make this connector from a copper beryllium copper alloy which is then gold plated. The connector has a leader section 11 which is generally straight. The length of this leader section should be sufficient to permit the leader section to pass completely through the stacked circuit boards and is preferably 0.175 inches. The connector 10 has a plurality of bends formed along the length of the connector, one such bend is depicted at 12. The spacing of the bends 13 corresponds to the interboard spacing of the module and is preferably 0.0277 inches. Upon insertion into the module, the bends deform into contact with the plated through holes of the boards defining contact sections 8. It is important to note that the connector does not undergo substantial plastic deformation in the insertion process, and the contact sections are urged into conformity with the holes primarily through the elastic resilience of the connector material.

Figure 2:
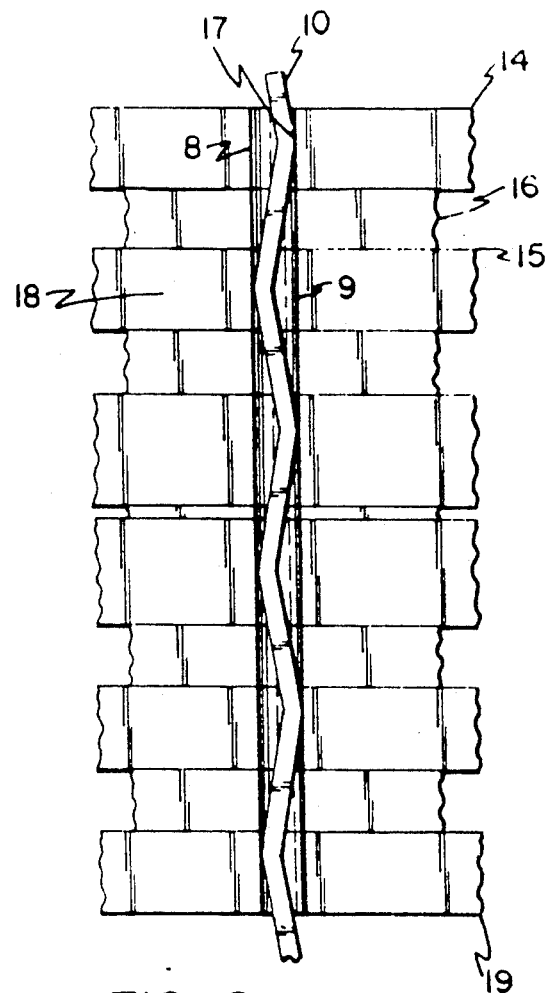
FIG. 2 is a cut-away view of a Z-axis connector installed in a module assembly.

Turning to FIG. 2, the connector 10 is shown inserted into a stack of circuit boards. The circuit boards have plated-through holes as shown at 8 and 9 to permit electrical interconnection with the board. Individual boards such as 14 and 15 are connected by the deformed connector which provides contact sections 17 and 18. The boards 14 and 15 are separated by a spacer 16. In some applications, it may be important that the spacer not contact the connector 10 since contact would reduce the force exhibited by the contact section. The relatively large distance between contact sections allows this form of connector to tolerate a relatively large amount of misalignment of the through plated holes. This is of practical value since there is some misalignment of the boards within the module. As shown in FIG. 2, the leader section is removed after insertion of the connector into the module. It may be desirable to leave a small portion of the connector extending beyond the board 19 to facilitate removal of the connector. It is also preferable to have all the bends in one plane so that the connector may deform torsionally to relieve and equalize stress at the contact sections to promote good electrical contact.

Figure 3:
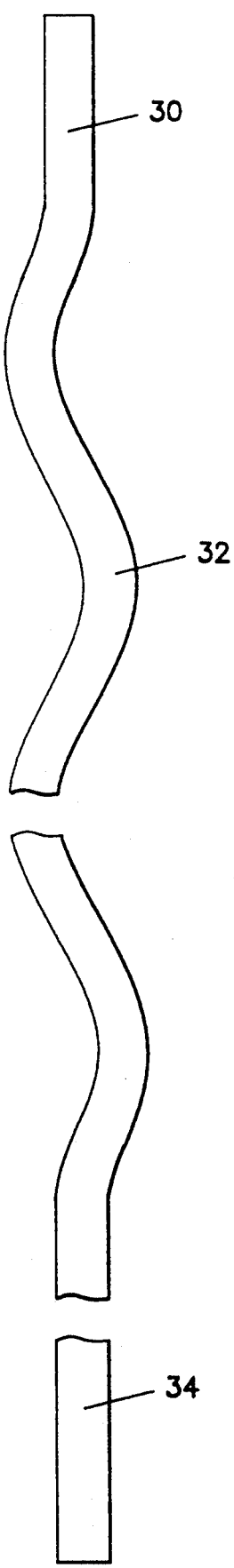
FIG. 3 shows an alternate preferred shape of a Z-axis connector.
Figure 4:
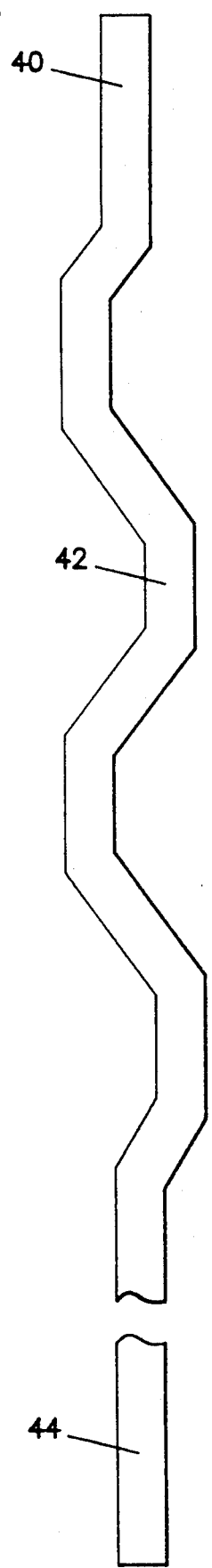
FIG. 4 shows an alternate preferred shape of a Z-axis connector.

FIGS. 3 and 4 show alternate preferred embodiments of the Z-axis connectors of the present invention. FIG. 3 shows a detailed view of a connector 30 having a sinusoidal kinked portion 32 which is used for the interconnection of through-plated holes on stacked circuit board assemblies and a leader portion 34. In an alternate preferred shape of the Z-axis connector, FIG. 4 shows kinked portions 42 of the connector 40 having more squared corners and a leader section 44. The dimensions of the connectors of FIGS. 3 and 4 are substantially similar to those of FIG. 1. Those skilled in the art will readily recognize the required modifications to the dimensions shape and pitch of any of the connectors of the preferred embodiments of the present invention which would be required to match the connectors to the application of stacked circuit boards of different dimensions.

The connectors may be manufactured according to the teachings of the present invention as individual devices having a short tail section, a long leader section and a central portion. In an alternate usage, the connectors may be produced as a continuous string provided on a spool in which the connector is alternately presented as leader sections or central sections. In this fashion, the bulk material may be cut to the desired lengths from the spool for use in automated insertion equipment.

It will be appreciated by those skilled in the art that the connectors could, alternately be formed of a primarily non-metallic resilient material such as nylon or any number of a variety of other resilient metals. In such an embodiment, the connector could be coated with a gold or other electrically conductive layer to allow the connector to transmit electric signals or power between the boards 14 and 15.

Although a specific embodiment has been illustrated and described herein, it will be appreciated by those of ordinary skill in the art that any arrangement which is calculated to achieve the same purpose may be substituted for the specific embodiment shown. For example, different processing steps, different electrical connection patterns, or different materials than those disclosed in the detailed description could be used. This application is intended to cover any adaptations or variations of the present invention. Therefore, it is manifestly intended that this invention be limited only by the claims and the equivalents thereof.

What is claimed is:

1. A conductive Z-axis connector for electrically interconnecting a plurality of stacked circuit boards having electrically conductive openings, comprising:

a primarily non-metallic resilient apparatus formed primarily of a material having a sufficiently high elastic limit to avoid plastic deformation of said apparatus after insertion into said conductive openings, said apparatus peripherally dimensioned smaller than said conductive openings;

said apparatus having a generally linear body disposed along a longitudinal axis including a plurality of off-axis displacements adapted for making electrical contact within said conductive openings, each of said displacements lying in one plane and each displacement further displacing said body in one direction away from said longitudinal axis;

said body being of a sufficient axial length to interconnect at least two of said plurality of stacked circuit boards;

said body being substantially plated with an electrically conductive material; and a substantially straight leader section connected to said apparatus, said leader section being of a sufficient axial length to assist in installing said apparatus in said conductive openings formed through at least two of said plurality of stacked circuit boards.

2. The connector of claim 1, wherein said connector is formed primarily of nylon.

3. The connector of claim 1, wherein said electrically conductive plating is primarily gold.

4. The connector of claim 1, wherein said off-axis displacements are substantially in a kinked shape.

5. The connector of claim 1, wherein said off-axis displacements are substantially sinusoidally shaped.

6. The connector of claim 1, wherein said off-axis displacements are substantially parallel to the longitudinal axis of said body and consecutive off-axis displacements are connected by substantially straight sections.

* * * * *

UNITED STATES PATENT AND TRADEMARK OFFICE
CERTIFICATE OF CORRECTION

PATENT NO. : 5,152,696
DATED : October 6, 1992
INVENTOR(S) : Krajewski, et. al.

It is certified that error appears in the above-indentified patent and that said Letters Patent is hereby corrected as shown below:

Column 1, lines 6 and 7, "patent application" should read --Patent Application-- therefor.

Column 1, line 50, delete "a" after the word "to" -- therefor.

Column 2, line 48, insert --.-- after the word "board" -- therefor.

Column 3, line 33, "though" should read --through-- therefor.

Column 3, lines 37, 40, 42, 47 and 50, "patent application" should read -- Patent Application-- therefor.

Signed and Sealed this

Nineteenth Day of October, 1993

Attest:

BRUCE LEHMAN

*Attesting Officer*  *Commissioner of Patents and Trademarks*